United States Patent
Lin et al.

(10) Patent No.: US 6,274,450 B1
(45) Date of Patent: Aug. 14, 2001

(54) METHOD FOR IMPLEMENTING METAL OXIDE SEMICONDUCTOR FIELD EFFECT TRANSISTOR

(75) Inventors: Tony Lin, Tien-Liao Hsiang; Coming Chen, Tao-Yuan; Jih-Wen Chou, Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/398,733

(22) Filed: Sep. 17, 1999

(51) Int. Cl.⁷ .................................... H01L 21/336
(52) U.S. Cl. ...................... 438/305; 438/294; 438/595
(58) Field of Search .................... 438/294, 305, 438/595, FOR 199, FOR 188, FOR 388

(56) References Cited

U.S. PATENT DOCUMENTS 5,162,884 * 11/1992 Liou et al. .

* cited by examiner

Primary Examiner—George Fourson
Assistant Examiner—Michelle Estrada

(57) ABSTRACT

A method for manufacturing metal oxide semiconductor field effect transistor is disclosed. The metal oxide semiconductor field effect transistor is formed by a specific fabricating process that disadvantages of thermal damage are effectively prevented. According to the method, first a substrate is provided. Second, an isolation and a well are formed in the substrate, and then a first dielectric layer, a conductive layer and an anti-reflection coating layer are formed on the substrate sequentially. Third, a gate is formed on the substrate, and then a source and a drain are formed in the substrate and a spacer is formed on the substrate. Fourth, both source and drain are annealed, and then a first salicide is formed on both source and drain. Fifth, a second dielectric layer is formed on the substrate and is planarized, where the anti-reflecting coating layer is totally removed and the conductive layer is partially removed. Sixth, a second salicide is formed on the conductive layer. Seventh, the spacer is removed and both a halo and a source drain extension are formed in substrate. Finally, a third dielectric layer is formed on second dielectric layer. Obviously, one main characteristic of the invention is both source drain extension and halo are formed after a plurality of thermal processes such as deposition, annealing and formation of salicide.

18 Claims, 9 Drawing Sheets

METHOD FOR IMPLEMENTING METAL OXIDE SEMICONDUCTOR FIELD EFFECT TRANSISTOR

BACKGROUND OF THE INVENTION

1. Field of the Invention

This invention is in the field of integrated circuits, and is more specifically directed to fabrication of metal oxide semiconductor field effect transistor that comprises ultra-shallow junction.

2. Description of the Prior Art

Metal oxide semiconductor field effect transistor (MOSFET) is generally used in contemporary electronic products. These advantages of field effect transistor comprise lower temperature formation of the metal-semiconductor barrier, low resistance along the channel width and good heat dissipation for power devices.

The conventional fabrication of MOSFET is described in following paragraph, herein a flow sheeting is disclosed in FIG. 1. First, as first block 11 shows, provide a substrate that as usual the substrate comprises a plurality of structures in and on it, such as isolations and wells. Second, as second block 12 shows, form gate, source drain extension (SDE) and halo in and on the substrate. Third, as third block 13 shows, form spacer, source and drain in and on the substrate. Finally, as block 14 shows, form salicade on source, drain and gate, and then cover the substrate by a dielectric layer. Where function of SDE is similar to function of lightly doped drain but density of SDE is higher than lightly doped drain, and conductivity type of halo is opposite to conductivity type of SDE and halo is used to prevent short channel effect. Of course, salicade is used to provide contact window and can be replaced by other device.

Thus, structure of MOSFET comprises source, drain, gate, spacer and lightly doped drain (or called as SDE). Beside, as scale of MOSFET is decreased, in order to match the size of source/drain and size of gate, shallow junction is broadly used. Herein, function of shallow junction is to reduce resistance and scale of source and drain.

On the other hand, owing to the fact that quality of MOSFET is limited by available technology of related fabrication, naturally as scale of MOSFET is decreased then some disadvantages are appeared for each fabricating technology can only be suitable for a specific scale. For example, quality of shallow junction is degraded by following thermal processes of formation of MOSFET, and the degradation is more serious when thickness of shallow junction is further decreased.

Moreover, ultra-shallow junction is generally used as width of gate is less than about 0.25 microns, and a typical thickness of ultra-shallow junction is about 200 angstroms to 500 angstroms. Therefore, many following process of formation of MOSFET will induce serious disadvantages and let ultra-junction be degraded, no matter it is a depositing process, an annealing process or even an etching process.

For example, owing to the fact that thermal processes will increase diffusion coefficient of doped particles and then doped particles inside source and drain will significantly diffuse out source and drain, the effective length of channel is shorten by diffused doped particles and induces serious short channel effect. Thus, the source drain resistance will be increased.

Beside, according to previous introduction, it is crystal-clear that both SDE and halo are formed before spacer, source, drain and salicide, and then qualities of both halo and SDE are affected by following forming process of MOSFET. For example, the smaller thickness of shallow junction obviously increases the probability that doped particles diffuse across the margin of shallow junction.

Thus, it is desired to develop a new fabrication of the metal oxide semiconductor field effect transistor to overcome these disadvantages of conventional fabrication. And it is more important when gate width of the MOSFET is less than 0.25 microns and ultra-shallow junction is required.

SUMMARY OF THE INVENTION

It is an object of the invention to provide a method for manufacturing a metal oxide semiconductor field effect transistor.

It is another object of the invention to provide such a method that implement an MOSFET with ultra-shallow junction and low source drain resistance.

It is a further object of the invention to provide a manufacturable fabrication of MOSFET.

It is still a further object of the invention to provide a method to decrease the RC delay time of MOSFET.

In order to explain the invention that relates to a method of manufacturing metal oxide semiconductor transistor, a specific fabricating process that efficiently prevent many disadvantages of conventional fabrication of MOSFET is presented as an embodiment.

The content of the embodiment is described as following: First, a substrate is provided. Second, an isolation and a well are formed in the substrate, and then a first dielectric layer, a conductive layer and an anti-reflection coating layer are formed on the substrate in sequence. Third, a gate is formed on the substrate, and then a source and a drain are formed in the substrate and a spacer is formed on the substrate. Fourth, both source and drain are annealed, and then a first salicide is formed on both source and drain. Fifth, a second dielectric layer is formed on the substrate and is planarized, where the anti-reflecting coating layer is totally removed and the spacer is partially exposed. Sixth, a second salicide is formed on the conductive layer. Seventh, the spacer is removed and then both a halo and a source drain extension are formed in substrate. Finally, a third dielectric layer is formed on second dielectric layer.

Obviously, in the invention, both source drain extension and halo are formed after a plurality of thermal processes such as deposition, annealing and formation of salicide. By the way, both SOE and halo are not degraded by these thermal processes.

Summary, the main characteristic of the invention is both source drain extension and halo are formed after a plurality of thermal processes such as deposition, annealing and formation of salicide. Then doped particles inside both SDE and halo will not thermally diffuse across margin of both SDE and halo, and salicide on source and drain will not be diffused by thermal processes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 2A:
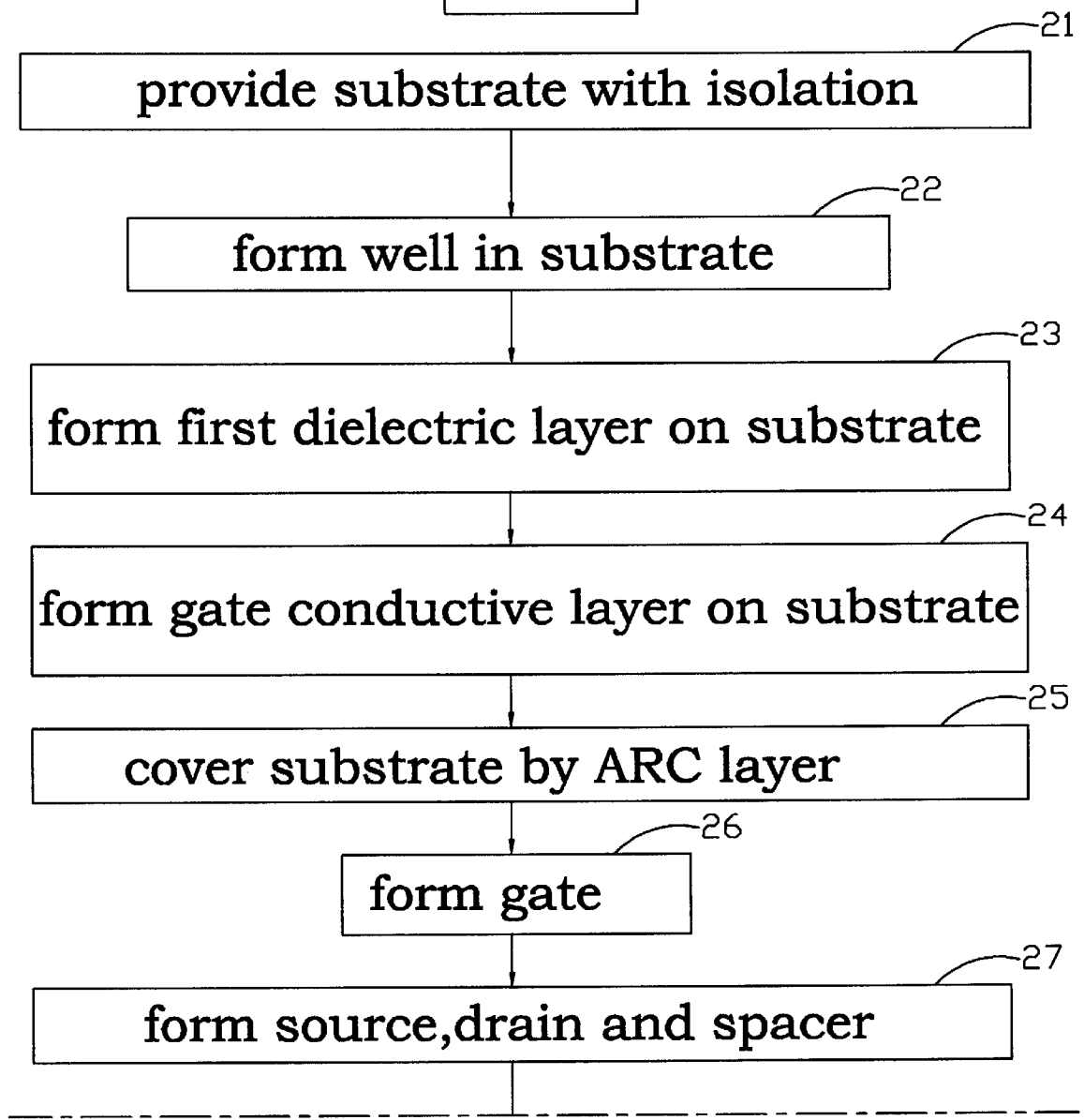
FIG. 2A to FIG. 2B are a flow sheeting about fabrication of field effect transistor in accordance with one embodiment.
Figure 2B:
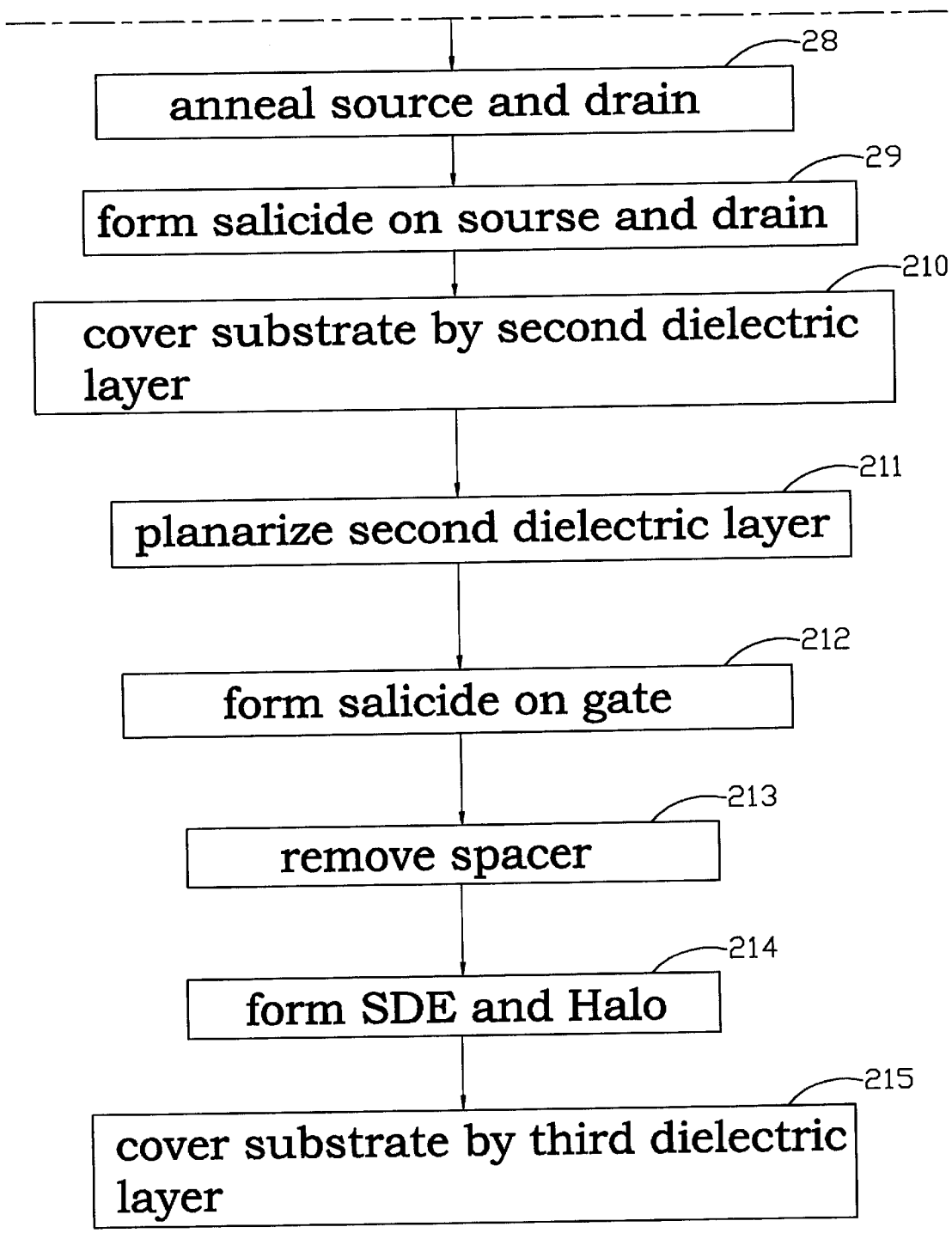

The fabrication of the presented invention is introduced by a flow sheeting as shown in FIG. 2A and FIG. 2B, and is explained in following paragraphs.

The provided fabrication of the invention can be divided into three parts: first part: formation of gate; second part: formation of source, drain, salicide; and third part: formation of SDE and halo.

Referring to FIG. 2A, the first part of provided fabrication comprises first block 21 to sixth block 26.

First as first block 21 shows, provide a substrate with isolation, variety of isolation comprises shallow trench isolation and field oxide. Second, as second block 22 shows, form well in the substrate, herein conductivity type of substrate can be equal to conductivity type of substrate or different to conductivity type of substrate. Third, as third block 23 shows, form first dielectric layer on the substrate, first dielectric layer is used to form oxide part of gate and is broadly provided by oxide. Fourth, as fourth block 24 shows, form gate conductive layer on substrate and covers first dielectric layer, as usual material of gate conductive layer is polysilicon or metal. Fifth, as fifth block 25 shows, cover substrate by anti-reflection coating (ARC) layer. Sixth, as sixth block 26 shows, form gate where both photolithography process and etching process are used.

Referring to FIG. 2A and FIG. 2B, the second part of provided fabrication comprises seventh block 27 to twelfth block 212.

First, as seventh block 27 shows, form source, drain, and spacer. Second, as eighth block 28 shows, anneal source and drain. Of course, as usual whole substrate with and structure in and on it are annealed at the same time. Third, as ninth block 29 shows, form salicide on source and drain. Fourth, as tenth block 210 shows, cover substrate by second dielectric layer. Fifth, as eleventh block 211 shows, planazize second dielectric layer, and let the spacer is exposed and ARC layer is totally removed. Sixth, as twelfth block 212 shows, form salicade on gate. Where the salicide on gate can be different the salicide on source and drain.

Referring to FIG. 2B, the third part of provided fabrication comprises thirteenth block 213 to fifteenth block 215.

First, as thirteenth block 213 shows, remove spacer and it is removed by wet etching. Second, as fourteenth block 214 shows, form SDE and halo. Third, as fifteenth block 215 shows, cover substrate by third dielectric layer but the gap of removed spacer does not need to be filled by the third dielectric layer.

Figure 1:
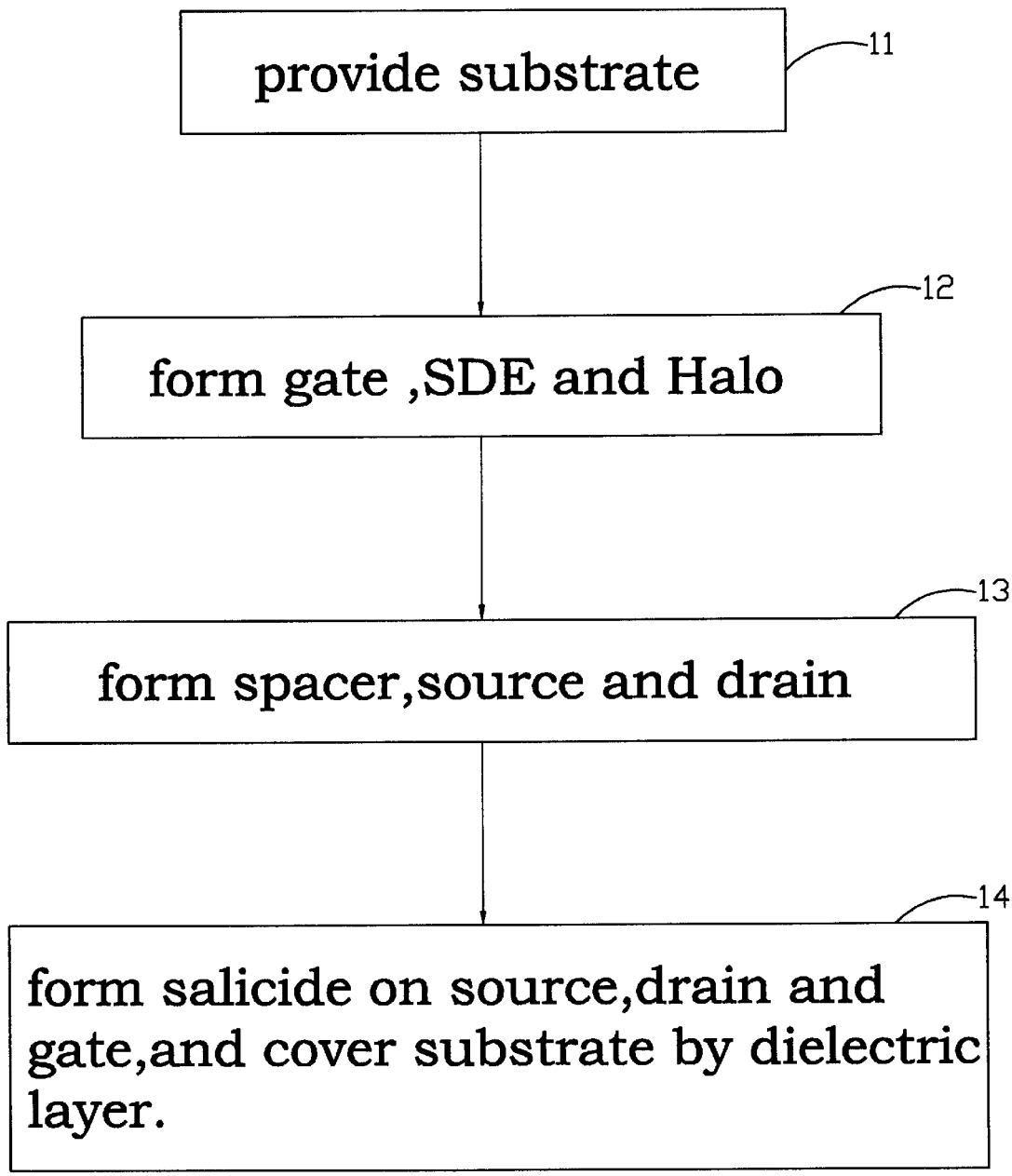
FIG. 1 is a flow sheeting about conventional fabrication of field effect transistor.

To compare with conventional fabrication of MOSFET that is introduced by FIG. 1, it is crystal-clear that the main difference between the invention and the convention fabrication is the forming sequence of two groups. First group essentially includes SDE and halo, and second group essentially includes source, drain, spacer and salicide.

By comparing FIG. 1 and FIG. 2, obviously, in conventional fabrication, the second group is formed after the first group, and then first group is affected by any process of fabrication of second fabrication. For example, the annealing process of forming salicide will induce thermal diffusion of halo and SDE. In contrast, in the proposed invention, the first group is formed after the second group, and then all processes of second group will not affect first group. On the other words, any thermal process and implanting process will not induce diffusion of doped particles of both SDE and halo.

Beside, another characteristic of the invention is that spacer can be provided by air. The advantage is that dielectric constant of air is about 1 but dielectric constant of conventional dielectric layer is about from 3.9 (oxide) to 7.9 (SiN), which is also called silicon nitride. Then the RC delay time of MOSFET is effectively decreased by the air spacer that conventional fabrication can not provide.

In order to unravel the present method more clearly, the present method for manufacturing metal oxide semiconductor field effect transistor is described in following paragraphs and FIG. 3 to FIG. 14.

Figure 3:
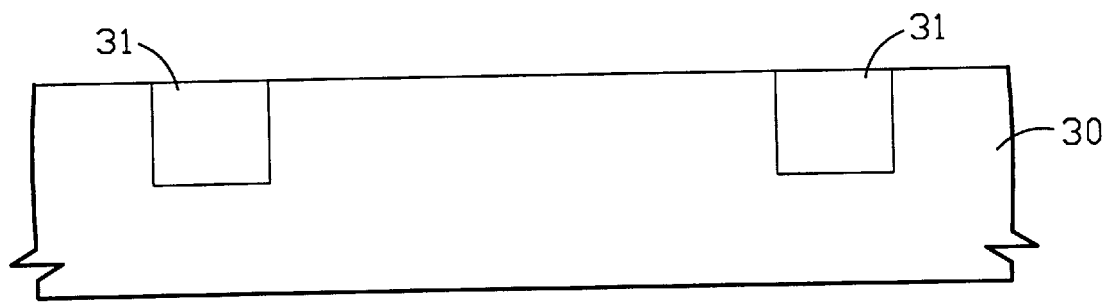
FIG. 3 to FIG. 14 are a series of cross-sectional views that illustrate different steps of the fabrication of metal oxide semiconductor field effect transistor in accordance with the embodiment of the invention.

Fist, as FIG. 3 shows, substrate 30 is provided and isolations 31 are formed in substrate 30. Varieties of isolations 31 comprise field oxide and shallow trench isolation (STI), but STI is favorable for shallow junction and ultra-shallow junction.

Figure 4:
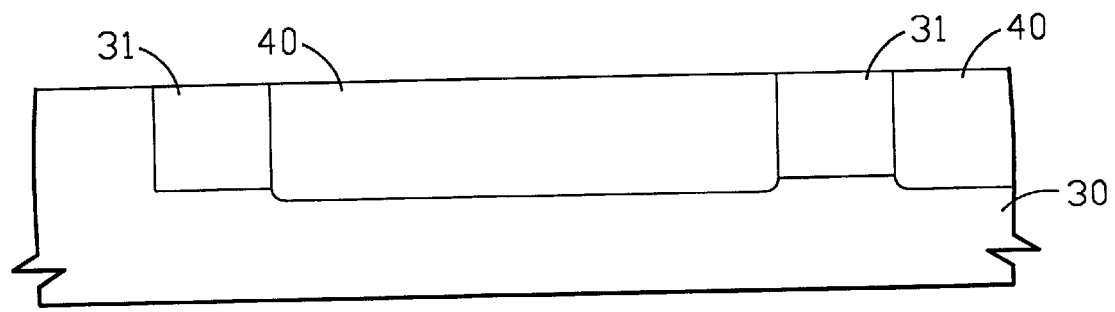

Second, as FIG. 4 shows, wells 40 are formed in substrate 30. Where each well 40 is almost enclosed by isolations 31 and is isolated from other wells 40. Moreover, conductivity type (density) of each well 40 can be equal to conductivity type of substrate 30 or different to conductivity type of substrate 30.

Figure 5:
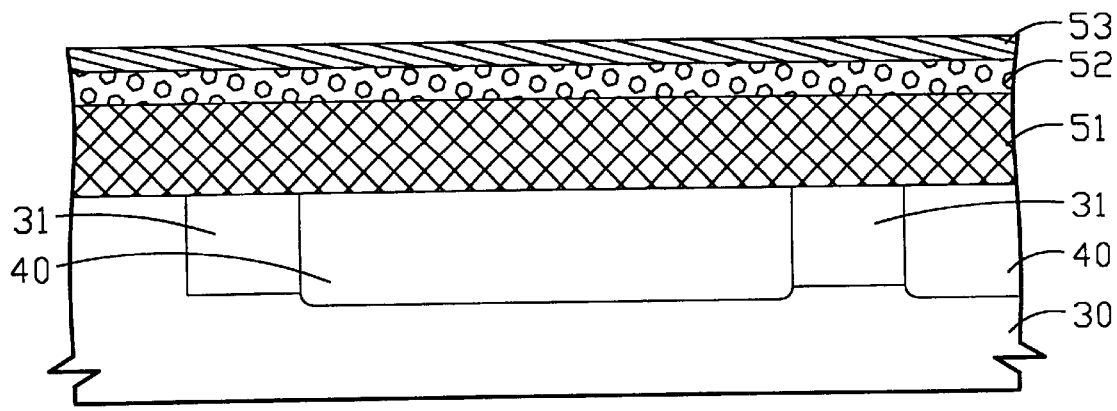

Third, as FIG. 5 shows, first dielectric layer 51, conductive layer 52 and anti-reflection coating layer 53 are formed on substrate 30 in sequence. Moreover, owing to the fact that first dielectric layer 51 and conductive layer 52 are used to form gate, possible materials of first dielectric layer 51 comprise oxide layer and possible materials of conductive layer 52 comprise polysilicon layer and metal layer. Beside, anti-reflection coating layer 53 not only can reduce intensity of reflective light and enhance performance of following photolithography process, but also can provide a passivation to protect the gate in following processes. In addition, possible materials of anti-reflection coating layer 53 comprise SiON, which is also called silicon oxynitride, layer.

Figure 6:
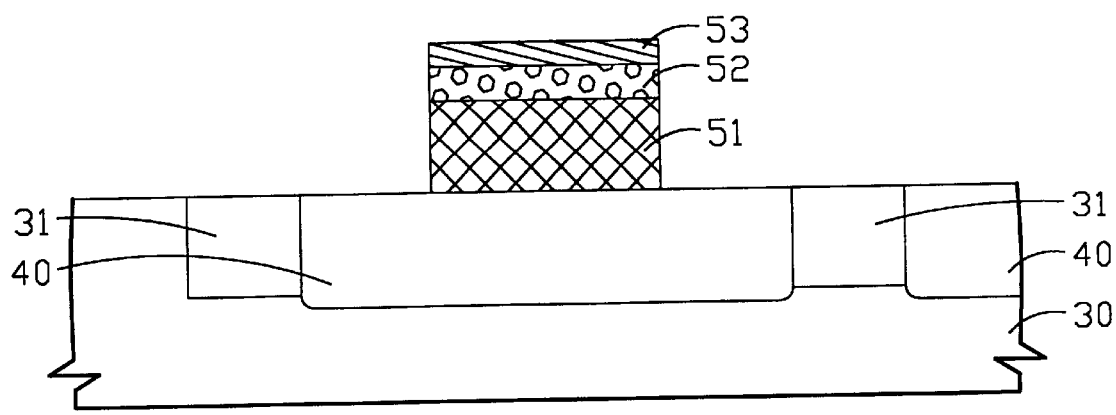

Fourth, as FIG. 6 shows, gate is formed on substrate 30. Herein, processes for patterning forming said gate comprises a photolithography process and an etching process. Beside, excess first dielectric layer 51, excess conductive layer 52 and excess anti-reflection layer 53 that not used to form the gate are totally removed.

Figure 7:
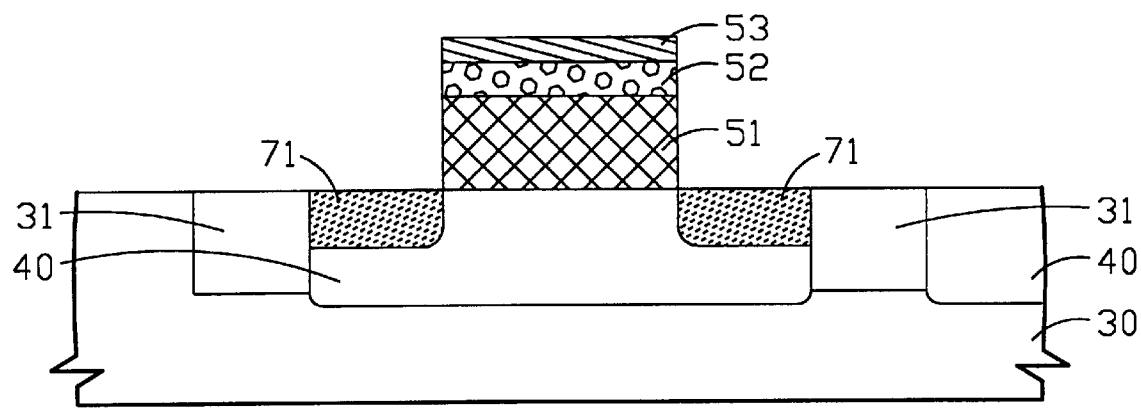

Fifth, as FIG. 7 shows, source 71 and drain 71 are formed in substrate 30 and are located around the gate.

Figure 8:
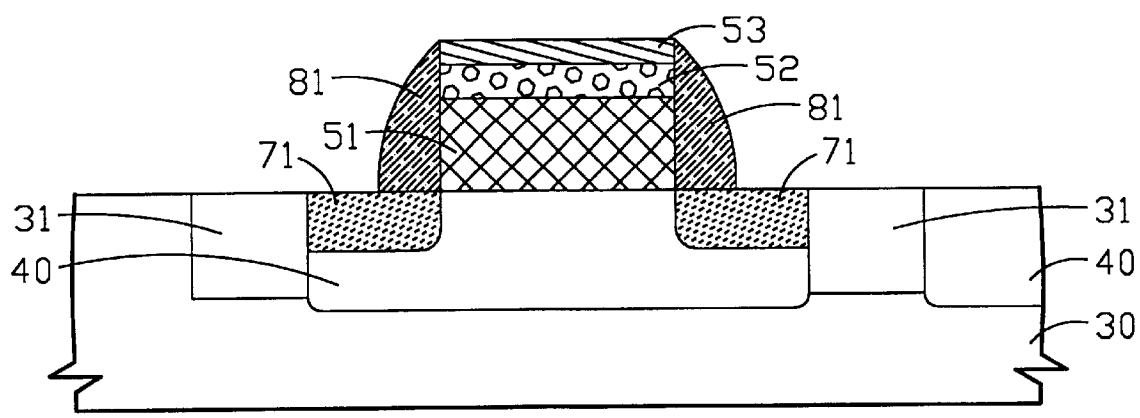

Sixth, as FIG. 8 shows, spacer 81 is formed on substrate 30 and is located around the gate. Herein, material of spacer 81 comprises SiN.

Figure 9:
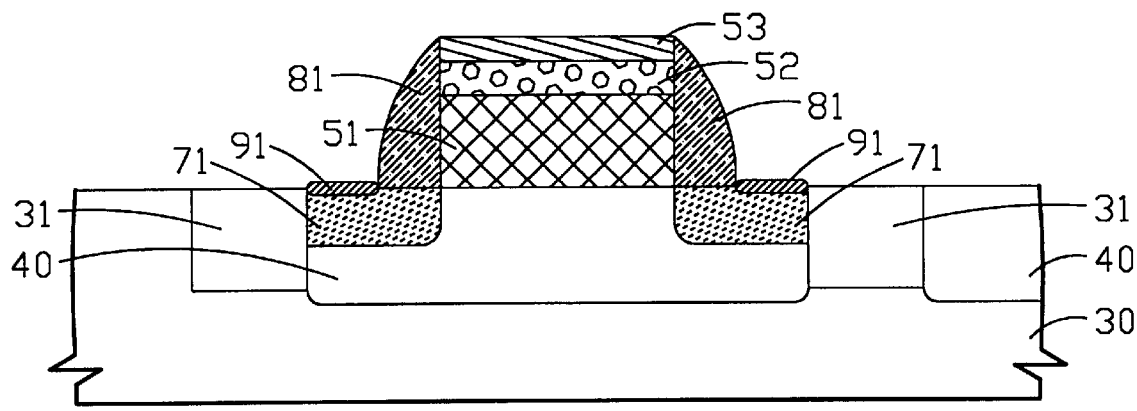

Seventh, as FIG. 9 shows, both source 71 and drain 71 are annealed and then first salicide 91 are formed on both source 71 and drain 71. Herein, possible materials of first salicide 91 comprise TiSi2, which is also called titanium silicide. In addition, because the gate is still covered by anti-reflection layer 53, first salicide 91 will not be formed on the gate.

Figure 10:
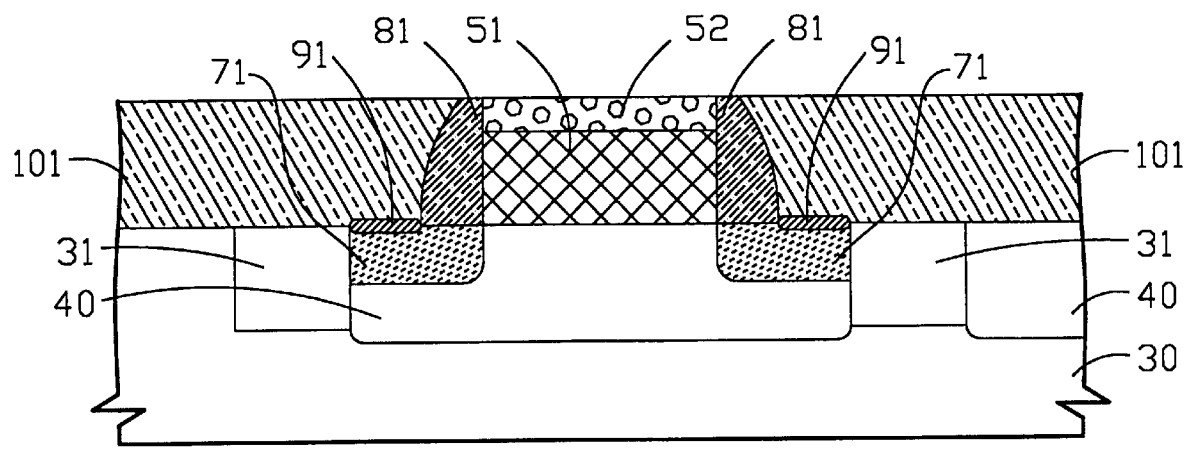

Eighth, as FIG. 10 shows, second dielectric layer 101 is formed on substrate30 and usually totally covers the gate and spacer 81, and then first dielectric layer 101 is planarized. Thus, anti-reflecting coating layer 53 is totally removed and conductive layer 52 of the gate is partially removed, and then spacer 81 is exposed. Beside, processes for planarizing second dielectric layer 111 comprise chemical mechanical polishing process.

Figure 11:
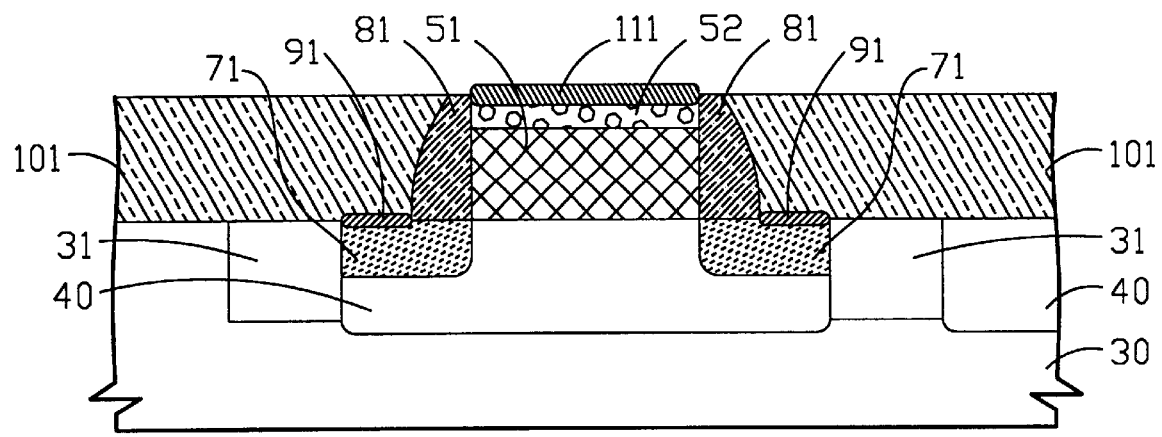

Ninth, as FIG. 11 shows, second salicide 111 is formed on conductive layer 52. Herein, possible materials of first salicide 91 comprise CoSi2, which is also called cobalt silicide. Beside, second salicide 111 is optional when conductive layer 52 is a metal layer. Moreover, when conductive layer 52 is polysilicon layer, second salicide 111 is almost necessary but when conductive layer 52 is metal layer, second salicide 111 is not always necessary. Of course, if scale of the MOSFET is larger, salicide is not necessary.

Figure 12:
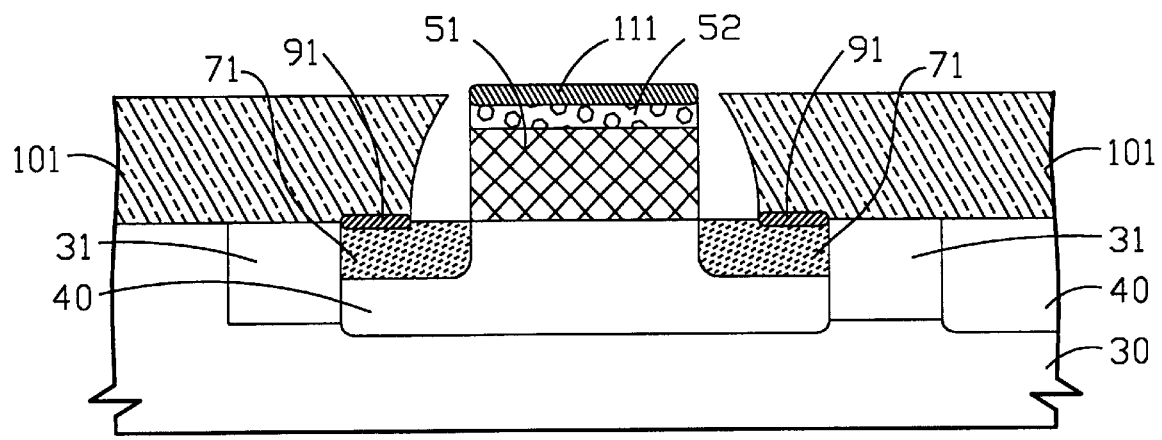

Tenth, as FIG. 12 shows, spacer 81 is removed. Herein, processes for removing spacer 81 comprise wet etching process, and category of etching solution of the wet etching process comprises H3PO4, which is also called sulphuric acid. Moreover, when spacer 81 is formed by SiN, useful etching solution usually is H3PO4.

Figure 13:
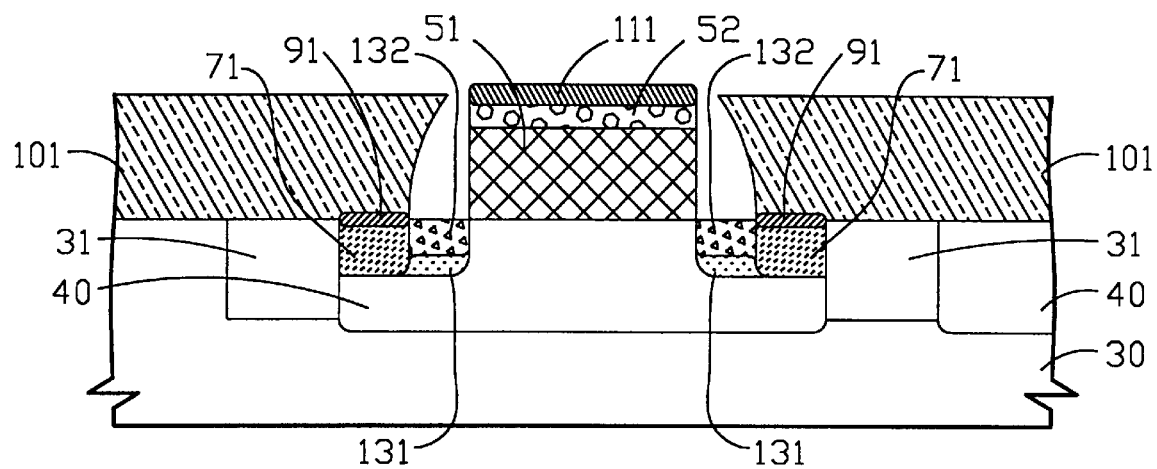

Eleventh, as FIG. 13 shows, both halo 131 and source drain extension 132 are formed in substrate30 and are located around the gate. Moreover, both halo 131 and source drain extension (SDE) 132 are located between the gate and source 71 (drain 71). Moreover, conductivity type of halo 131 is opposite to conductivity type of source drain extension 132, and halo 131 is located behind source drain extension 132.

Figure 14:
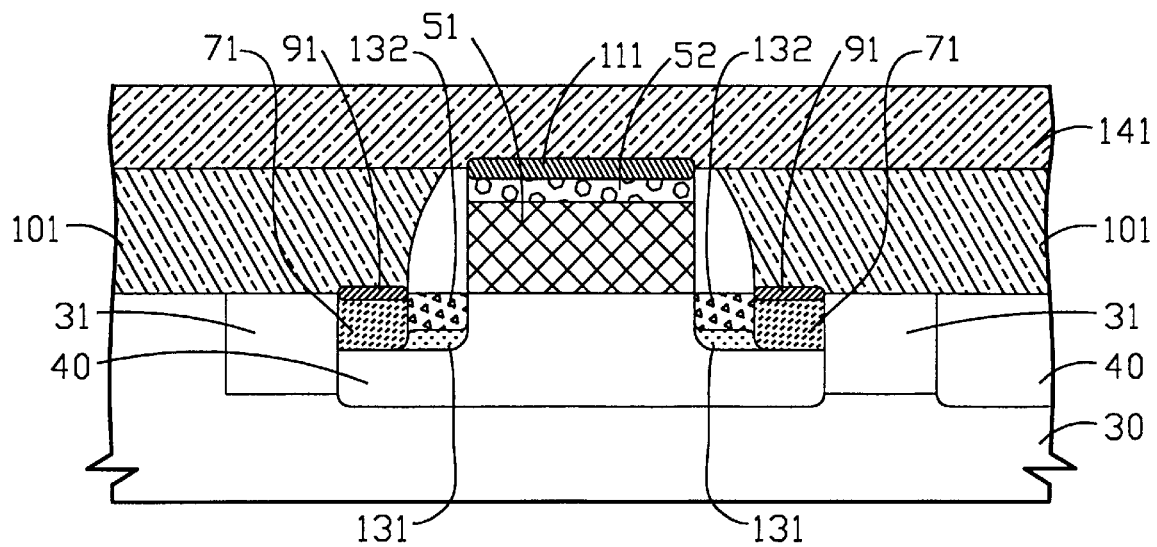

Twelfth, as FIG. 14 shows, third dielectric layer 141 is formed on second dielectric layer 101, wherein third dielectric layer 141 totally covers the gate.

Incidentally, when the scale of the MOSFET is decreased to let shallow junction be required, a typical width of the gate is about less than 0.25 microns. Moreover, a typical thickness of ultra-shallow junction is about 200 angstroms to 500 angstroms.

Obviously, the main characteristic of the invention is both source drain extension and halo are formed after a plurality of thermal processes such as deposition, annealing and formation of salicide. Then doped particles inside both SDE and halo will not diffuse across margin of them, and salicide on source and drain will not be diffused by thermal processes. Thus, both ultra-shallow shallow junction and low source drain resistance can be provided by the invention.

Moreover, it is difficult to fill the gape of removed spacer 81 by third dielectric layer 141, especially when width of MOSFET is small and then area of exposed spacer 81 is small. Therefore, owing to the fact that air can reduce capacitance and then decrease the RC delay time of MOSFET, it is clear that the proposed invention is efficient for small scale MOSFET, such as MOSFET with shallow junction or ultra-shallow junction.

Additional, another important advantage of the invention is that both SDE and halo are formed just after spacer 81 is removed. Thus, because substrate 30 is covered by second dielectric layer 101 and only part of substrate 30 is exposed through gap of removed spacer 81, most of implanted particles are absorbed by second dielectric layer 101 expect these implanted particles that pass through the gap of removed spacer 81. Therefore, the formation of both halo and SDE can be self-aligned and junction integrity is increased.

Of course, another important advantage of the invention is that formation of first salicide 91 can be separate from formation of second salicide 111. Therefore, material of each salicide can be chosen by specific requirements, and then it is possible to form thicker second silicide 111 without junction leakage issue of first salicide 91.

While the invention has been described by previous embodiment, the invention is not limited there to. To the contrary, it is intended to cover various modifications and the scope of these claims therefore should be accorded to the broadest interpretation so as to encompass all such modifications and similar arrangement, procedures and products.

What is claimed is:

1. A method for manufacturing a metal oxide semiconductor field effect transistor, said method comprising steps of:
    providing a substrate;
    forming an isolation in said substrate;
    forming a well in said substrate, wherein said well is enclosed by said isolation;
    forming a first dielectric layer on said substrate;
    forming a conductive layer on said first dielectric layer;
    forming an anti-reflection coating layer on said conductive layer;
    removing portions of said anti-reflection coating layer, said conductive layer and said first dielectric layer to form a gate;
    forming a source and a drain in said substrate around said gate;
    forming a spacer on a sidewall of said gate;
    annealing said source and said drain;
    forming a first salicide on said source and said drain;
    forming a second dielectric layer on said substrate, wherein said second dielectric layer totally covers said gate and said spacer;
    planarizing said second dielectric layer, wherein said anti-reflecting coating layer is totally removed and said spacer is exposed;
    forming a second salicide on said conductive layer;
    removing said spacer;
    forming a halo and a source drain extension in said substrate, wherein said halo and said source drain extension is located between said gate and said source/drain; and
    forming a third dielectric layer on said second dielectric layer, wherein said third dielectric layer totally covers said gate.

2. The method according to claim 1, wherein said isolation comprises shallow junction isolation.

3. The method according to claim 1, wherein said first dielectric layer comprises an oxide layer.

4. The method according to claim 1, wherein said conductive layer comprises a polysilicon layer.

5. The method according to claim 1, wherein said conductive layer comprises a metal layer.

6. The method according to claim 1, wherein said anti-reflection coating layer comprises a silicon oxynitride layer.

7. The method according to claim 1, wherein the process of removing portions of said antireflection-coating layer, said conductive layer, and said first dielectric layer to form said gate comprises a photolithography process and an etching process.

8. The method according to claim 1, wherein the thickness of said shallow junction is about 200 angstroms to 500 angstroms.

9. The method according to claim 1, wherein the material of said spacer comprises silicon nitride.

10. The method according to claim 1, wherein the material of said first salicide comprises titanium silicide.

11. The method according to claim 1, wherein the process of planarizing said second dielectric layer comprises a chemical mechanical polishing process.

12. The method according to claim 1, whereby a portion of said conductive layer is removed by said process of planarizing said second dielectric layer.

13. The method according to claim 1, wherein the material of said second salicide comprises cobalt silicide.

14. The method according to claim 1, wherein the process of removing said spacer comprises a wet etching process.

15. The method according to claim 14, wherein an etching solution of said wet etching process comprises sulphuric acid.

16. The method according to claim 1, wherein the conductivity type of said halo is opposite to the conductivity type of said source drain extension.

17. The method according to claim 1, wherein said halo is located behind said source drain extension.

18. A method for manufacturing a metal oxide semiconductor field effect transistor, said method comprising steps of:

- providing a substrate;
- forming an isolation in said substrate;
- forming a well in said substrate, wherein said well is enclosed by said isolation;
- forming a first dielectric layer on said substrate;
- forming a metal layer on said first dielectric layer;
- forming an anti-reflection coating layer on said metal layer;
- removing portions of said anti-reflection coating layer, said metal layer and said first dielectric layer to form a gate;
- forming a source and a drain in said substrate around said gate;
- forming a spacer on a sidewall of said gate;
- annealing said source and said drain;
- forming a first salicide on said source and said drain;
- forming a second dielectric layer on said substrate, wherein said second dielectric layer totally covers said gate and said spacer;
- planarizing said second dielectric layer, wherein said anti-reflecting coating layer is totally removed and said spacer is exposed;
- removing said spacer;
- forming a halo and a source drain extension in said substrate, wherein said halo and said source drain extension is located between said gate and said source/drain;
- and forming a third dielectric layer on said second dielectric layer, wherein said third dielectric layer totally covers said gate.

* * * * *